US006735339B1

(12) United States Patent
Ubale

(10) Patent No.: US 6,735,339 B1
(45) Date of Patent: May 11, 2004

(54) MULTI-STAGE ENCODING OF SIGNAL COMPONENTS THAT ARE CLASSIFIED ACCORDING TO COMPONENT VALUE

(75) Inventor: Anil Wamanrao Ubale, Fremont, CA (US)

(73) Assignee: Dolby Laboratories Licensing Corporation, San Francisco, CA (US)

(*) Notice: Subject to any disclaimer, the term of this patent is extended or adjusted under 35 U.S.C. 154(b) by 669 days.

(21) Appl. No.: 09/699,101

(22) Filed: Oct. 27, 2000

(51) Int. Cl.$^7$ .................................................. G06K 9/36
(52) U.S. Cl. ........................................................ 382/232
(58) Field of Search ................................. 382/232, 233, 382/234, 238, 239, 240, 244–247; 358/426.05, 426.12; 708/203; 341/51, 65, 67, 87, 95, 106, 107

(56) References Cited

U.S. PATENT DOCUMENTS

| 5,764,374 | A | * | 6/1998 | Seroussi et al. ............ 382/244 |
| 5,915,038 | A | * | 6/1999 | Abdel-Mottaleb et al. .. 382/209 |
| 5,951,623 | A | * | 9/1999 | Reynar et al. ............... 708/203 |
| 5,991,449 | A | * | 11/1999 | Kimura et al. .............. 382/238 |
| 6,404,931 | B1 | * | 6/2002 | Chen et al. .................. 382/239 |

OTHER PUBLICATIONS

F. Rubin, "Arithmetic Stream Coding Using Fixed Precision Registers," IEEE Trans. on Information Theory, vol. IT–25, No. 6, Nov. 1979, pp. 672–675.
J. Rissanen, G. G. Langdon, Jr., "Universal Modeling and Coding," IEEE Trans. on Information Theory, vol. IT–27, No. 1, Jan. 1981, pp. 12–23.
C. B. Jones, "An Efficient Coding System for Long Source Sequences," IEEE Trans. on Information Theory, vol. IT–27, No. 3, May 1981, pp. 280–291.
G. G. Langdon Jr., J. Rissanen, "A Simple General Binary Source Code," IEEE Trans. on Information Theory, vol. IT–28, No. 5, Sep. 1982, pp. 800–803.
B.–H. Juang, A. H. Gray, Jr., "Multiple Stage Vector Quantization for Speech Coding", Intl. Conf. on Acoust., Speech, and Signal Proc., vol. 1, Apr. 1982, pp. 597–600.

T. R. Fischer, "A Pyramid Vector Quantizer," IEEE Trans. on Information Theory, vol. IT–32, No. 4, Jul. 1986, pp. 586–583.
I. H. Witten, R. M. Neal, and J. G. Cleary, "Arithmetic Coding for Data Compression," Communications of the ACM, vol. 30, No. 6, Jun. 1987, pp. 520–540.
T. C. Bell, J. G. Cleary, I. H. Witten, "Text Compression," Prentice Hall, Englewood Cliffs, New Jersey, 1990, pp. 100–139.
J.A. Thomas, T. M. Cover, "Elements of Information Theory," Chapter 2, Prentice–Hall, 1991, pp. 12–49.
A. Gersho and R. M. Gray, "Vector Quantization and Signal Compression", Kluwer Academic Publishers, Boston, 1992, pp. 451–459.
D. Cadel, G. Parladori, "Pyramid Vector Coding for High Quality Audio Compression," Int. Conf. on Acoust., Speech and Signal Proc., 1997, pp. 343–346.
S–H. Park, Y–B. Kim, S–W. Kim, Y–S. Seo, "Multi–layer Bit–Sliced Bit–Rate Scalable Audio Coding," AES 103rd Convention, 1997, pp. 1–11.
Y–B. Kim, S–H. Park and S–W. Kim, "Proposal for a Core Experiment on Low Complexity Scalable Codec for MPEG–4 Audio," ISO/IEC/TCI.SC29 WG11, MPEG97/M2088, Apr. 1997.

* cited by examiner

*Primary Examiner*—Jose L. Couso
(74) *Attorney, Agent, or Firm*—David N. Lathrop, Esq.; Gallagher & Lathrop

(57) ABSTRACT

A high degree of compression can be achieved in audio and image coding systems by using a multiple-stage lossless encoding process having low computational cost that does not require high-accuracy pre-defined probability distribution functions of the information to be compressed. The multiple-stage encoding process classifies the signal components to be compressed into one of several classifications according to signal component value. Signal components placed into higher-level classifications are represented by tokens in the lower-level classifications. Each stage of the encoding process forms groups of signal components and tokens and applies a multi-dimensional encoding process to the groups. The dimension of the coding process is equal to the size of the group to which it is applied, and is chosen to balance computational requirements of the encoding process against compression performance.

84 Claims, 3 Drawing Sheets

MULTI-STAGE ENCODING OF SIGNAL COMPONENTS THAT ARE CLASSIFIED ACCORDING TO COMPONENT VALUE

TECHNICAL FIELD

The present invention pertains generally to audio and image coding systems and methods, and pertains more particularly to lossless compression techniques that can be used in audio and image coding systems to provide high levels of compression at low computational cost without requiring high-accuracy pre-defined probability distribution functions of the information to be compressed.

BACKGROUND ART

There is considerable interest among those in the fields of audio and image signal processing to reduce the amount of information required to represent audio and image signals without perceptible loss in signal quality. By reducing the amount of information required to represent such signals, the representations impose lower information capacity requirements upon communication paths and storage media. Of course, there are limits to the amount of reduction that can be realized without degrading the perceived signal quality.

Information capacity requirements can be reduced by applying either or both of two types of data compression techniques. One type, sometimes referred to as "lossy" compression, reduces information capacity requirements in a manner which does not assure, and generally prevents, perfect recovery of the original signal. Another type, sometimes referred to as "lossless" compression, reduces information capacity requirements in a manner that permits perfect recovery of the original signal.

Lossy Compression

Quantization is one well known digital lossy compression technique. Quantization can reduce information capacity requirements by reducing the number of bits used to represent each sample of a digital signal, thereby reducing the accuracy of the digital signal representation. The reduced accuracy or quantizing error is manifested as noise, therefore, quantization may be thought of as a process that injects noise into a signal. If the quantization errors are of sufficient magnitude, the quantizing noise will be perceptible and degrade the subjective quality of the coded signal.

Perceptual coding systems attempt to apply lossy compression techniques to an input signal without suffering any perceptible degradation by removing components of information that are imperceptible or irrelevant to perceived signal quality. A complementary decoding system can recover a replica of the input signal that is perceptually indistinguishable from the input signal provided the removed components are truly irrelevant.

So called split-band coding techniques are often used in perceptual coding systems because they can facilitate the analysis of an input signal to identify its irrelevant parts. A split-band encoder splits an input signal into several narrow-band signals, analyzes the narrow-band signals to identify those parts deemed to be irrelevant, and adaptively quantizes each narrow-band signal in a manner that removes these parts.

Split-band audio encoding often comprises the use of a forward or analysis filterbank to divide an audio signal into several subband signals each having a bandwidth commensurate with the so called critical bandwidths of the human auditory system. Each subband signal is quantized using just enough bits to ensure that the quantizing noise in each subband is masked by the spectral component in that subband and adjacent subbands. Split-band audio decoding comprises reconstructing a replica of the original signal using an inverse or synthesis filterbank. If the bandwidths of the filters in the filter banks and the quantization accuracy of the subband signals are chosen properly, the reconstructed replica can be perceptually indistinguishable from the original signal.

Two such coding techniques are subband coding and transform coding. Subband coding may use various analog and/or digital filtering techniques to implement the filterbanks. Transform coding uses various time-domain to frequency-domain transforms to implement the filterbanks. Adjacent frequency-domain transform coefficients may be grouped to define "subbands" having effective bandwidths that are sums of individual transform coefficient bandwidths.

Throughout the following discussion, the term "split-band coding" and the like refers to subband encoding and decoding, transform encoding and decoding, and other encoding and decoding techniques that operate upon portions of the useful signal bandwidth. The term "subband" refers to these portions of the useful signal bandwidth, whether implemented by a true subband coder, a transform coder, or other technique. The term "subband signal" refers to a split-band filtered signal within a respective subband.

Another lossy compression technique is called scaling. Many coding techniques including split-band coding convey signals using a scaled representation to extend the dynamic range of encoded information represented by a limited number of bits. A scaled representation comprises one or more "scaling factors" associated with "scaled values" corresponding to elements of the encoded signals. Many forms of scaled representation are known. By sacrificing some accuracy in the scaled values, even fewer bits may be used to convey information using a "block-scaled representation." A block-scaled representation comprises a group or block of scaled values associated with a common scaling factor.

Lossless and Hybrid Compression

Lossless compression techniques reduce information capacity requirements of a signal without degradation by reducing or eliminating components of the signal that are redundant. A complementary decompression technique can recover the original signal perfectly by providing the redundant component removed during compression. Examples of lossless compression techniques include run-length encoding, adaptive and nonadaptive forms of differential coding, linear predictive coding, transform coding, and forms of so called entropy coding such as Huffman coding. Variations, combinations and adaptive forms of these compression techniques are also known.

Generally, the best levels of compression are achieved by hybrid techniques that combine lossless and lossy compression techniques. Two types of hybrid techniques are discussed below.

An example of the first hybrid type combines lossless transform coding with lossy vector quantization to quantize transform coefficients. Vector quantization uses a codebook of quantized values in an N-dimensional vector space and quantizes each source vector to the value that is associated with the closest codebook vector. Computational complexity for the process needed to find the closest vector increases geometrically as the dimension of the codebook vector space increases. In principle, vector quantization provides optimum encoding according to a rate-distortion theory, as discussed in Gersho and Gray, "Vector Quantization and Signal Compression," Prentice-Hall, 1992; however, optimum performance is achieved only asymptotically as the dimension of the vector space approaches infinity. As a result, near-optimum coding performance can be achieved only in exchange for incurring much higher computational costs. Alternative quantization methods such as transform weighted interleaved vector quantization and pyramid vector quantization, described in Iwakami et al., "High Quality Audio Coding at Less than 64 kb/s by using Transform-Domain Weighted Interleaved Vector Quantization (TWIN-VQ)," IEEE Proc. of ICASSP, 1995, pp. 3095–98, and Cadel et al., "Pyramid Vector Coding for High Quality Audio Compression," IEEE Proc. of ICASSP, 1996, may be used to reduce computational complexity. Unfortunately, even the computational cost of these methods is very high.

An example of the second hybrid type combines lossless transform coding with lossy uniform quantization of the transform coefficients and a subsequent lossless encoding of the quantized coefficients using, for example, Huffman encoding. The Huffman encoding technique uses a codebook that is based on a pre-determined probability distribution function (PDF) of input values, and that associates shorter-length codes to the more frequently occurring values. Both scalar-Huffman encoding and multi-dimensional vector-Huffman encoding are possible. This particular example of the second hybrid type can work reasonably well provided the assumed PDF of input values is reasonably close to the actual distribution of values to be encoded. It is well known, however, that Huffman encoding can actually increase information capacity requirements if the assumed PDF is a poor model of the actual value distribution.

Another lossless encoding technique is discussed in International Patent Application Publication No. WO 99/62253 entitled "Scalable Audio Coder and Decoder." This technique, referred to as Tunstall encoding, is a dual of Huffman encoding in that it uses fixed-length code words to represent variable-length strings of input values. This technique can use a parametric PDF model and can, therefore, select a model from a set of models representing diverse probability statistics. Although many different PDF can be created using the parametric model, like Huffman encoding, the performance of this technique depends on the accuracy of the PDF.

Yet another lossless encoding technique known as Bit-Sliced Arithmetic Coding (BSAC) is discussed in the MPEG4 standards document ISO/IEC WD 14496-3:1997 v4.0 (E) w1745tf "T/F Core Description," Section 2.12, pp 60–63. This technique, which is similar to the compression technique used in the JPEG image coding standard, first aligns quantized transform coefficients that are represented in binary, concatenates bits in each of the coefficients that have the same significance to form vectors of bits, and then arithmetically encodes the resulting vectors. For example, one vector is formed from a concatenation of the least significant bit (LSB) of each coefficient, another vector is formed from the next LSB of each coefficient, and so on. Unfortunately, this technique does not perform very well in perceptual coding systems because it assumes that each coefficient has been quantized with the same number of bits. When the number of significant bits for various coefficients changes across or within a band, for example, the more significant bits in some of the coefficients, which are merely sign extension bits, are needlessly coded.

DISCLOSURE OF INVENTION

It is an object of the present invention to provide encoding and decoding techniques that can be used in coding systems, such as perceptual audio and image coding systems for example, to provide a high level of lossless compression without requiring an accurate pre-defined probability distribution of values to be encoded and without imposing high computational complexity.

In accordance with one aspect of the present invention, a signal is encoded by placing signal components into one of a plurality of classifications according to signal component value, each classification having a rank representing a range of values associated with the classification; and for a respective classification, assembling signal components into one or more groups, each group having a number of elements to encode that varies inversely with the rank of the respective classification; and applying an encoding process to each of the groups, wherein the encoding process that is applied to a respective group has a dimension that is proportional to the number of elements in the respective group.

In accordance with another aspect of the present invention, a signal is encoded by placing some signal components into a first classification according to signal component value; assembling the signal components placed into the first classification into one or more first groups each having a number of elements that is equal to a first number; applying an encoding process to each of the first groups, where the encoding process has a dimension that is proportional to the first number; placing at least some of the signal components not placed into the first classification into a second classification according to signal component value; assembling the signal components placed into the second classification into one or more second groups each having a number of elements that is equal to a second number, where the second number is not equal to the first number; and applying an encoding process to each of the second groups, wherein the encoding process has a dimension that is proportional to the second number.

In accordance with a further aspect of the present invention, an encoded signal is decoded by receiving codes that represent one or more signal components placed into one of a plurality of classifications according to signal component value, each classification having a rank representing a range of values associated with the classification; and for each respective code, identifying the respective classification of the signal components represented by the respective code; and applying a decoding process to the respective code to obtain a group of elements, the group having a number of elements that varies inversely with the rank of the respective classification, wherein the decoding process that is applied to the respective code has a dimension that is proportional to the number of elements in the group of elements; and obtaining the one or more signal components from the group of elements.

In accordance with yet another aspect of the present invention, an encoded signal is decoded by applying a decoding process to a first code to obtain a first group having a first number of elements, wherein the decoding process has a dimension that is proportional to the first number; obtaining from the first group one or more signal components placed into a first classification and having values within a range of values associated with the first classification; applying a decoding process to a second code to obtain a respective second group having a second number of elements, wherein the decoding process has a dimension that is proportional to the second number; and obtaining from the second group one or more signal components placed into a second classification having values within a range of values associated with the second classification.

The various features of the present invention and its preferred embodiments may be better understood by referring to the following discussion and the accompanying drawings in which like reference numerals refer to like elements in the several figures. The contents of the following discussion and the drawings are set forth as examples only and should not be understood to represent limitations upon the scope of the present invention.

MODES FOR CARRYING OUT THE INVENTION

A. Encoding Apparatus

Figure 1:
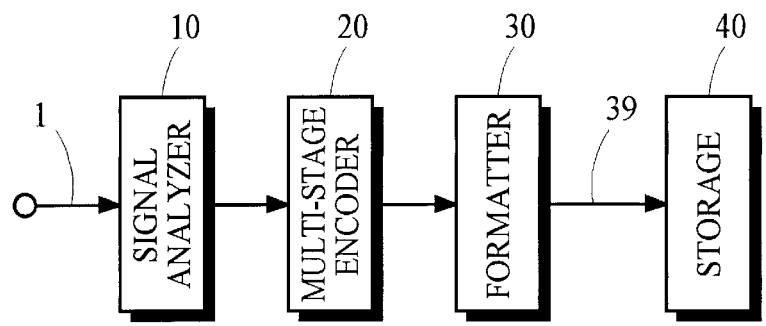
FIG. 1 is a block diagram of major components in an apparatus that encodes a signal according to the present invention.

FIG. 1 is a block diagram that illustrates major components in an apparatus that encodes a signal according to the present invention. Signal path 1 receives an input signal that conveys information intended for human perception, such as aural or visual information, for example. Signal analyzer 10 processes the input signal to generate signal components that represent the input signal, and multi-stage encoder 20 encodes and compresses these signal components. Formatter 30 assembles the compressed signal components into an encoded signal having a form that is suitable for transmission or storage, and passes this signal along path 39.

For example, formatter 30 may multiplex the compressed signal component into a bit stream and assemble into the bit stream error correction codes and/or frame synchronization patterns for transmission or identifying information for retrieval from storage. The encoded signal may be transmitted using baseband or modulated communication paths throughout the spectrum including from supersonic to ultraviolet frequencies. The encoded signal may also be recorded onto storage 40, which can be essentially any medium using essentially any information-recording technology. A few generic examples include magnetic tape, magnetic disk, optical disk and non-volatile solid-state memory.

1. Signal Analysis

Figure 2:
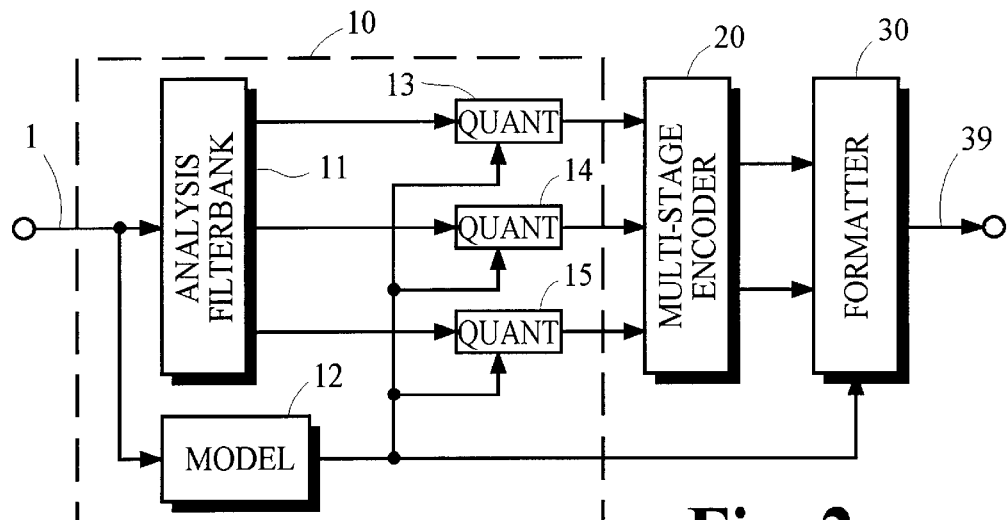
FIG. 2 is a block diagram of a split-band encoding apparatus that may be used to encode an input signal according to psychoperceptual principles.

FIG. 2 is a block diagram of a split-band encoding apparatus that may be used to encode an input signal according to psychoperceptual principles. These principles describe perceptual characteristics of the human aural or human visual systems, for example. The following discussion refers to audio signal encoding according to psychoacoustic principles; however, the use of psychoperceptual principles is not essential to the present invention.

Referring to FIG. 2, analysis filterbank 11 splits the input signal into a plurality of subband signals, and model 12 assesses the psychoacoustic properties of the input signal to provide control signals that control the quantization step size for each of quantizers 13, 14 and 15. In this example, which is known as a "forward-adaptive" system, model 12 makes its assessment directly from the input signal and passes an express indication of the quantization step sizes to formatter 30 for inclusion in the encoded signal. In an alternate implementation not shown in the figures, which is known as a "backward-adaptive" system, model 12 makes its assessment from information obtained from the subband signals that is subsequently passed to formatter 30 for inclusion in the encoded signal. In the forward-adaptive system, quantization information is passed expressly in the encoded signal. In the backward-adaptive system, quantization information is passed implicitly in the encoded signal.

Analysis filter bank 11 may be implemented in a wide variety of ways including recursive, non-recursive and lattice digital filters, one or more discrete transforms, and wavelet transforms. No particular implementation is important to the present invention. In one implementation, analysis filterbank 11 is implemented by a modified discrete cosine transform and a modified discrete sine transform according to a technique disclosed in Princen and Bradley, "Analysis/Synthesis Filter Bank Design Based on Time Domain Aliasing Cancellation," IEEE Trans. on Acoust., Speech, Signal Proc., vol. ASSP-34, 1986, pp. 1153–1161. In another implementation, analysis filterbank 10 is implemented by another modified cosine transform according to a technique disclosed in Princen, Johnson, and Bradley, "Subband/Transform Coding Using Filter Bank Designs Based on Time Domain Aliasing Cancellation," ICASSP 1987 Conf. Proc., May 1987, pp. 2161–64.

For ease of discussion, the following examples assume analysis filterbank 11 is implemented by one or more discrete time-domain-to-frequency-domain transforms that provide transform coefficients as the signal components. If another implementation is used instead, such as a set of quadrate mirror filters (QMF) or a polyphase filterbank, then analysis filterbank 11 provides signal components in the form subband signal samples.

Referring again to FIG. 2, quantizer 13 receives one or more transform coefficients from analysis filterbank 11, quantizes the one or more transform coefficients using a quantization step size that is adapted in response to a control signal received from model 12, and passes these quantized transform coefficients to multi-stage encoder 20. Similarly, quantizers 14 and 15 receive and quantize one or more transform coefficients using respective quantization step sizes that are adapted in response to control signals received from model 12. In this example, signal analyzer 10 provides quantized transform coefficients that are grouped into three subbands. Generally, practical implementations provide quantized transform coefficients that are grouped into twenty or more subbands; however, no particular number of subbands is critical. Preferably, uniform quantization is used within each subband to simplify the encoding process performed by multi-stage encoder 20; however, uniform quantization is not required.

2. Signal Component Encoding

Figures 3, 4:
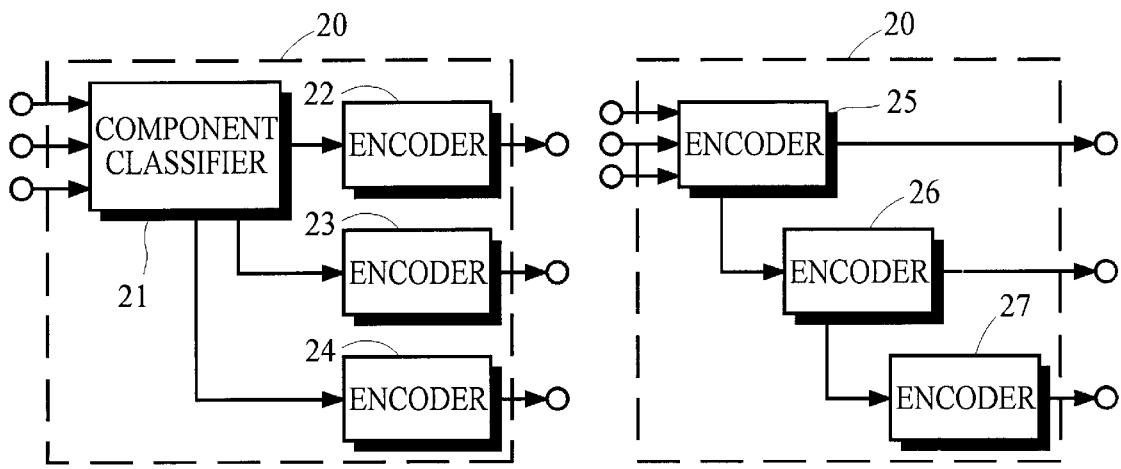
FIGS. 3 and 4 are block diagrams of multi-stage encoders.

FIGS. 3 and 4 illustrate block diagrams of two different implementations of multi-stage encoder 20. Referring to FIG. 3, component classifier 21 receives signal components from signal analyzer 10 and places each signal component into one of a plurality of classifications according to the value of the signal component. Signal components placed into a first classification are passed to encoder 22, signal components placed into a second classification are passed to encoder 23, and signal components placed into a third classification are passed to encoder 24. In this example, signal components are placed into one of three classifications; however, in principle any integer number of classifications greater than one may be used. The number of classifications should be chosen to balance coding efficiency against data storage requirements and computational cost.

a) Classification and Rank

In a preferred implementation, each classification is uniquely associated with a range of values within a set of non-overlapping ranges, and a component is placed into the classification associated with the range of values that includes the magnitude of the component. For example, one 8-bit system in which signal components may have an integer value within the interval from −128 to +127 places the signal components into one of three classifications according to the following ranges associated with each classification.

$$\text{Classification 1: } 0 \leq \{x\} \leq 3 \quad (1)$$

$$\text{Classification 2: } 3 < \{x\} \leq 30 \quad (2)$$

$$\text{Classification 3: } 30 < \{x\} \leq 128 \quad (3)$$

This particular example is used throughout the following discussion and accompanying figures. The following discussion assumes encoders 22, 23 and 24 receive signal components that are placed into classifications 1, 2 and 3, respectively.

Each classification has a "rank" that represents the span of the associated range. In the present example, the ranks of classifications 1, 2 and 3 are equal to 7, 54 and 196, respectively.

b) Encoding Dimension

Encoders 22, 23 24 each assemble the signal components into groups having a number of "elements" that varies inversely with the rank of the classification in which the signal components are placed. Preferably, the number of elements that are assembled into each group is roughly inversely proportional to the corresponding rank. An "element" represents a signal component and may either represent its value or may be a special token, which is discussed below.

Encoders 22, 23 and 24 also apply an encoding process to each group. The encoding process has a dimension that is equal to the number of elements in the group. Stated differently, a group represents a point in an N-dimensional space, where N is equal to the number of elements in the group. The particular point is determined by the values of the elements in the group. The encoding processes applied by encoders 22, 23 and 24 uniquely map each point in the N-dimensional space onto a code.

In a preferred implementation, encoders 22, 23 and 24 apply a lossless arithmetic encoding process to the quantized signal components. An arithmetic encoding process achieves compression by removing redundancies from the information conveyed by the "symbols" to be encoded.

A one-dimensional arithmetic encoding process assigns symbols to non-overlapping intervals on the real-line segment from 0.0 to 1.0 such that the length of each interval is equal to the probability of occurrence of the corresponding symbol. A symbol can be unambiguously represented by any real number that lies in the appropriate interval. Compression is achieved by choosing a number within the interval that can be expressed with fewer bits than is required to represent the symbol itself. A theorem guarantees that a number within the appropriate interval can be found such that its binary representation requires no more than $\lceil \log P \rceil$ bits, where P is the probability of occurrence of the particular symbol and $\lceil x \rceil$ denotes a function that returns the smallest integer equal to or greater than x. These symbols correspond to the values of the signal components to be encoded.

An N-dimensional arithmetic encoding process assigns symbols to non-overlapping regions of the N-dimensional space defined by a unit-length axis for each dimension such that the extent of each region is equal to the probability of occurrence of the corresponding symbol. Compression is achieved in a manner analogous to that described above for one-dimensional encoding.

An arithmetic encoding process is attractive because it is adaptive. The process begins with a "seed" probability distribution function (PDF) to initialize the probability model used for encoding. During the process, the probability model is updated to reflect the actual probability statistics of the symbols that are encoded. For more information, see Thomas and Cover, "Elements of Information Theory," Chapter 2, Prentice-Hall, 1991, and Witten, Neal and Cleary, "Arithmetic Coding for Data Compression," Communications of the ACM, vol. 30, no. 6, June 1987, pp. 520–540, both of which are incorporated herein by reference.

c) Signal Components and Tokens

A group assembled by encoder 22, 23 or 24 contains N elements having values that collectively define a point in N-dimensional space. An element represents a signal component and either represents the value of the signal component or is a special token that is a type of place holder for the signal component. Continuing the example discussed above, groups assembled by encoders 22, 23 and 24 contain elements with values that represent the values of signal components placed into the first, second and third classifications, respectively. These groups may also contain elements that are tokens representing signal components not placed in the respective classifications. Several implementations are discussed below.

(1) Bottom-to-Top Encoding

One implementation represents all signal components in the lowest classification level and represents a number of signal components that generally diminishes in progressively higher classification levels.

Figure 5:
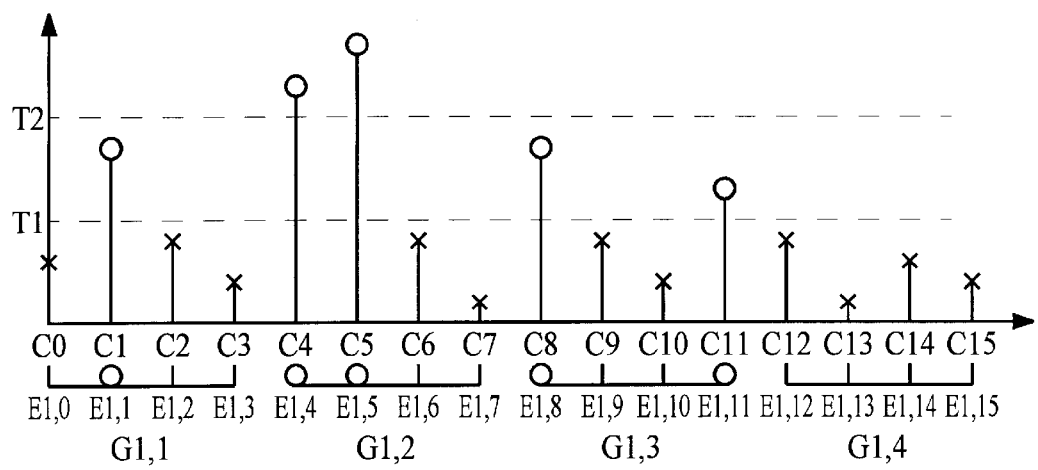
FIGS. 5–7 are graphical representations of a hypothetical set of signal components placed into classifications and encoded in different stages of a multi-stage encoder.

FIG. 5 illustrates a set of sixteen hypothetical signal components or transform coefficients $C_0$ through $C_{15}$ that are placed into different classifications according to their value and then encoded in different stages of multi-stage encoder 20. Each signal component is represented by a vertical line, the length of which corresponds to the magnitude of the signal component. The position of the line along the horizontal axis represents the frequency of the signal component.

In the example shown, the signal components have values from 0 to 15. Component classifier 21 places these signal components into one of three classifications by component value according to the three ranges shown above in expressions 1, 2 and 3. Signal components $C_4$ and $C_5$ have values that exceed the threshold $T_2$, which has a value of 30; therefore, these components are placed into classification 3. Signal components $C_1$, $C_8$ and $C_{11}$ have values that exceed threshold $T_1$, which has a value of 3, but do not exceed threshold $T_2$. These components are placed into classification 2. All other components have a value that is below threshold $T_1$; therefore, these components are placed into classification 1.

Referring to FIG. 5, the signal components not placed into classification 1 are represented by a line with a small circle at the top end. The signal components placed into classification 1 whose values will be encoded in a first stage of multi-stage encoder 20 are represented by a line with a small "X" at the top end.

In this example, encoder 22 assembles elements that represent all of the signal components $C_0$ through $C_{15}$ into groups $G_{1,1}$ through $G_{1,4}$ of four elements each. For example, group $G_{1,1}$ represents signal components $C_0$ through $C_3$ and includes four elements $E_{1,0}$ through $E_{1,3}$ in which elements $E_{1,0}$, $E_{1,3}$ and $E_{1,3}$ represent the values of signal components $C_0$, $C_2$ and $C_3$, respectively, and element $E_{1,1}$ is a special token indicating signal component $C_1$ is not placed into classification 1. Throughout the figures, a short vertical line denotes an element that represents the value of a signal component and a circle denotes a token element. Group $G_{1,2}$ includes four elements $E_{1,4}$ through $E_{1,7}$ in which elements $E_{1,6}$ and $E_{1,7}$ represent the values of signal components $C_6$ and $C_7$, respectively, and elements $E_{1,4}$ and $E_{1,5}$ are special tokens indicating signal components $C_4$ and $C_5$, respectively, are not placed into classification 1. Group $G_{1,3}$ includes four elements $E_{1,8}$ through $E_{1,11}$ in which elements $E_{1,9}$ and $E_{1,10}$ represent the values of signal components $C_9$ and $C_{10}$, respectively, and elements $E_{1,8}$ and $E_{1,11}$ are special tokens indicating signal components $C_8$ and $C_{11}$, respectively, are not placed into classification 1. Encoder 22 applies a 4-dimensional encoding process to the groups, which maps each group of four elements to an appropriate code.

Figure 6:
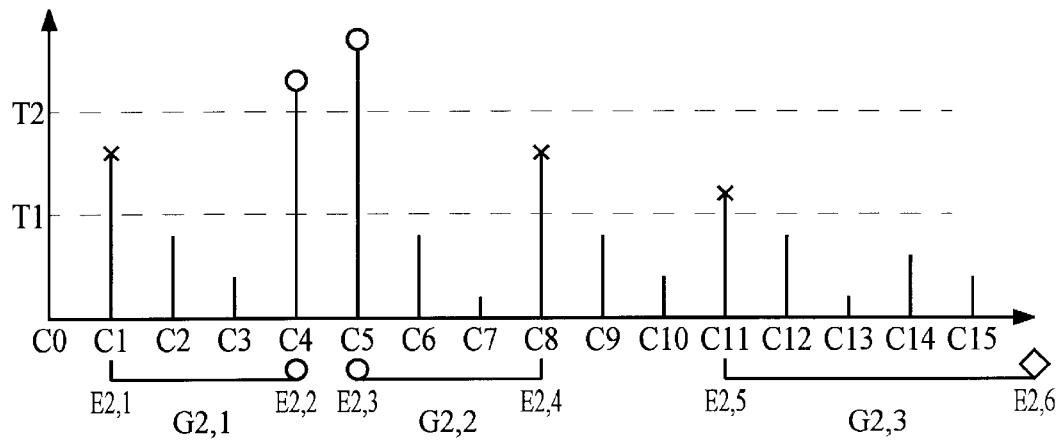

Referring to FIG. 6, the signal components not placed into classification 1 or 2 are represented by a line with a small circle at the top end. The signal components placed into classification 2 whose values will be encoded in a second stage of multi-stage encoder 20 are represented by a line with a small "X" at the top end.

Encoder 23 assembles elements representing signal components not placed into classification 1 into groups $G_{2,1}$, $G_{2,2}$ and $G_{2,3}$ of two elements each. In group $G_{2,1}$ element $E_{2,1}$ represents the value of signal component $C_1$ and element $E_{2,2}$ is a token indicating signal component $C_4$ is not placed into classification 2. Group $G_{2,2}$ includes elements $E_{2,3}$ and $E_{2,4}$ in which element $E_{2,3}$ is a token indicating signal component $C_5$ is not placed into classification 2 and element $E_{2,4}$ represents the value of signal component $C_8$. Group $G_{2,3}$ includes elements $E_{2,5}$ and $E_{2,6}$ in which element $E_{2,5}$ represents the value of signal component $C_{11}$ and element $E_{2,6}$ is a mere place holder that does not represent a signal component. A diamond-shaped symbol denotes this property of element $E_{2,6}$. The value of $E_{2,6}$ can be set arbitrarily as desired but preferably is chosen to obtain a pair of elements in group $G_{2,2}$ that, when encoded, map to a code having the lowest possible information requirement. Encoder 23 applies a 2-dimensional encoding process to the groups, which maps each group of two elements to an appropriate code.

Figure 7:
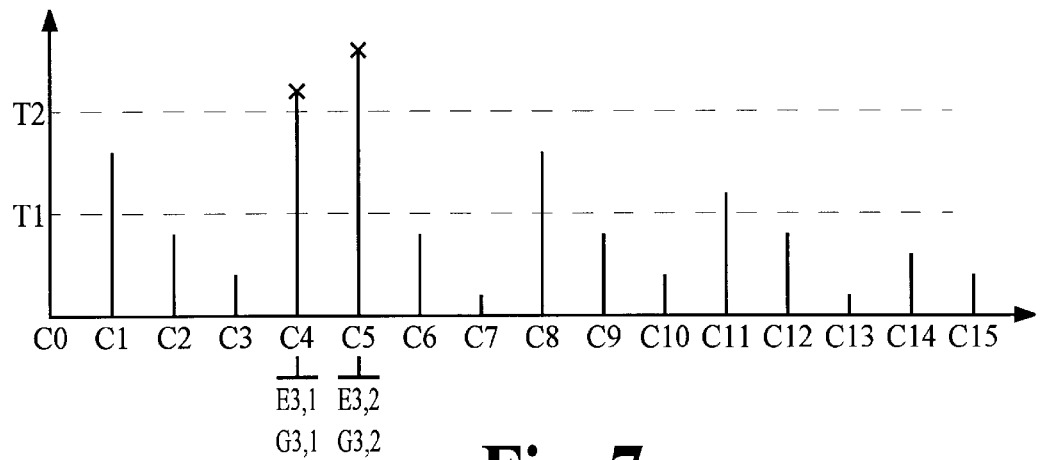

Referring to FIG. 7, the signal components placed into classification 3 whose values will be encoded in a third stage of multi-stage encoder 20 are represented by a line with a small "X" at the top end.

Encoder 24 assembles elements representing signal components placed into classification 3 into groups $G_{3,1}$ and $G_{3,2}$ of one element each. In group $G_{3,1}$ element $E_{3,1}$ represents the value of signal component $C_4$. In group $G_{3,2}$ element $E_{3,2}$ represents the value of signal component $C_5$. Encoder 24 applies a 1-dimensional encoding process to the groups, which maps each element to an appropriate code.

(2) Top-to-Bottom Encoding

Another implementation represents all signal components in the highest classification level and represents a number of signal components that generally diminishes in progressively lower classification levels. In this implementation, which is a simple variation of the bottom-to-top encoding implementation discussed above, component classifier 21 places signal components $C_0$ through $C_{15}$ into the same classifications discussed above.

Encoder 24 assembles elements that represent all of the signal components $C_0$ through $C_{15}$ into groups of one element each. Each element either represents the value of a respective signal component placed into classification 3, or it is a token indicating a respective signal component is not placed into classification 3. Encoder 24 applies a 1-dimensional encoding process to each of the groups.

Encoder 23 assembles elements representing signal components not placed into classification 3 into groups of two elements each. Each element either represents the value of a respective signal component placed into classification 2, or it is a token indicating a respective signal component is not placed into either classification 3 or classification 2. Encoder 23 applies a 2-dimensional encoding process to each of the groups.

Encoder 22 assembles elements representing the signal components placed into classification 1 into groups of four elements each. Each element represents the value of a respective signal component placed into classification 1. Encoder 22 also applies a 4-dimensional encoding process to each of the groups.

(3) Encoding Without Tokens

The tokens discussed above act as place holders for signal components. In the bottom-to-top implementation, for example, each token in the groups for classification 1 corresponds to a respective element in one of the groups for classification 2. Similarly, each token in the groups for classification 2 corresponds to a respective element in one of the groups for classification 3. This correspondence can be used in a complementary decoder to control how decoded information should be merged to correctly reconstruct a complete set of signal components.

Groups may be assembled without tokens if some other form of information is provided that identifies the classification for each signal component. For example, component classifier 21 can provide control information in which there is an indication of the classification for each signal component. This control information is passed to formatter 30 for inclusion in the encoded signal. With this implementation, encoder 22 assembles groups of four elements that represent only the signal components placed into classification 1, encoder 23 assembles groups of two elements that represent only the signal components placed into classification 2, and encoder 24 assembles groups of one element that represent only the signal components placed into classification 3. This alternative implementation may be attractive if the information requirement of the encoded signal is less, or if the computational complexity of the encoding processes is reduced.

d) Distributed Classification

FIG. 4 illustrates an alternative implementation of multi-stage encoder 20. In this implementation, signal component classification and encoding is distributed among three encoding components.

Encoder 25 receives signal components from signal analyzer 10 and places signal components into classification 1 according to component value. Encoder 25 assembles groups of four elements each, in which the elements either represent values of the signal components placed into classification 1 or are tokens representing signal components not placed into classification 1. Encoder 25 passes to encoder 26 those signal components not placed into classification 1 and applies a 4-dimensional encoding process to the groups it has assembled.

Encoder 26 receives signal components from encoder 25 and places signal components into classification 2 according to component value. Encoder 26 assembles groups of two elements each, in which the elements either represent values of the signal components placed into classification 2 or are tokens representing signal components not placed into either classification 1 or classification 2. Encoder 26 passes to encoder 27 those signal components not placed into either classification 1 or classification 2 and applies a 2-dimensional encoding process to the groups it has assembled.

Encoder 27 receives signal components from encoder 26 and places signal components into classification 3 according to component value. Encoder 27 assembles groups of one element each, in which the element represents the value of a signal component placed into classification 3 and applies a 1-dimensional encoding process to the groups it has assembled.

This distributed-classification implementation just described is analogous to the implementation for bottom-to-top encoding discussed above. Distributed classification may also be used in implementations that are analogous to the implementations for top-to-bottom encoding and for encoding without tokens.

e) Additional Features

As a practical matter, the amount of memory needed to store the elements and various tables required for the encoding process can be reduced by having the elements represent the difference between a signal component value and the lower bound of the range associated with a classification. In the examples discussed above for encoders 24, 27 and classification 3, each element $E_{3,j}$ representing the value of signal component $C_K$ would be set equal to the difference $(C_K - R_{3L})$, where $R_{3L}$ is equal to 3, which is the lower bound for the range of classification 3.

In some systems, the trade off between coding performance and computational performance may be improved by using aspects of the present invention for only some signal components. In split-band audio coding systems, for example, it is anticipated that the present invention may be used to greatest advantage with lower-frequency signal components. It may possible, therefore, to improve overall performance by restricting use of the present invention to selected subbands.

It may also be possible to obtain additional improvements in performance by applying different encoding processes in the various stages of multi-stage encoder 20. This feature is explained in the following example for an audio coding application, which also illustrates some other considerations discussed above. In this example, the signal components are 14-bit transform coefficients that may have a value from −8192 to 8191.

A direct application of a particular encoding process to a set of signal components provides the highest level of compression that is possible for that particular process. This encoding efficiency is achieved at great computational cost, however, because a large set of 16,384 symbols is required to represent all possible values of the signal components. The multi-stage process described herein does sacrifice some of this efficiency but it also realizes a considerable reduction in computational cost. The number of classifications and the range of values for each classification may be chosen to balance a trade off between encoding efficiency and computational efficiency.

In this example, the signal components are placed into one of four classifications according to the following ranges:

Classification 1: $0 \leq \{x\} \leq 1$ (4)

Classification 2: $-9 \leq x < -1$ and $1 < x < 9$ (5)

Classification 3: $-136 \leq x < -9$ and $9 \leq x \leq 136$ (6)

Classification 4: $136 < \{x\} \leq 8192$ (7)

Signal components placed into classification 1 may have any of three integer values within the closed interval $[-1, 1]$. As a result, each element that is assembled into a group for classification 1 may be represented by any one of four symbols; three symbols correspond to respective signal component values and the fourth symbol is the token that is used to represent signal components that are not placed into classification 1. A group of four elements may have any one of $4^4 = 256$ possible combinations of symbols, which may be represented as a 4-dimensional space of 256 points. The encode process for this classification is essentially a function that maps each point in the space to a unique code. In a preferred implementation, an arithmetic coding process is used for classification 1.

In applications that frequently encode a sequence of signal components having some predefined value such as zero, coding efficiency may be increased by using an additional symbol to represent the sequence of signal components. In one example where signal components are transform coefficients and a sequence of the highest-frequency coefficients are often zero, the additional symbol may be used to terminate a segment of an encoded bit stream by indicating all non-zero coefficients have been encoded.

Signal components placed into classification 2 may have any of fifteen integer values within the intervals $[-9, -1]$ and $(1, 9)$. As a result, each element that is assembled into a group for classification 2 may be represented by any one of sixteen symbols; fifteen symbols correspond to respective signal component values and the sixteenth symbol is the token that is used to represent signal components that are not placed into classification 2. A group of two elements may have any one of $16^2 = 256$ possible combinations of symbols, which may be represented as a 2-dimensional space of 256 points. In a preferred implementation, an arithmetic coding process is used to map each point in the 2-dimensional space for classification 2 to a unique code.

Signal components placed into classification 3 may have any of 255 integer values within the intervals $[-136, -9)$ and

[9, 136]. As a result, each element that is assembled into a group for classification 3 may be represented by any one of 256 symbols; 255 symbols correspond to respective signal component values and the 256th symbol is the token that is used to represent signal components that are not placed into classification 3. A group of one element may be represented as a 1-dimensional space of 256 points. In a preferred implementation, an arithmetic coding process is used to map each point in the 1-dimensional space for classification 3 to a unique code.

Signal components placed into classification 4 may have any one of 16,111 values. It is possible to use one or more stages of classification and encoding to process these values in a manner that is similar to what is done for the smaller magnitude values, but this approach is not attractive in most audio coding applications because the benefit of compression is low and the computational cost is high. In preferred implementations according to this example, the signal components placed into classification 4 are subjected only to uniform quantization using a quantization step size that is determined according to psychoacoustic principles. Special codes or other control information may be used to indicate the number of bits that are used to convey these signal components.

B. Decoding Apparatus

Figure 8:
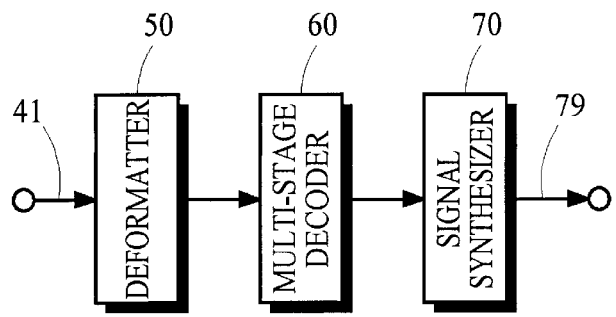
FIG. 8 is a block diagram of major components in an apparatus that decodes an encoded signal according to the present invention.

FIG. 8 is a block diagram that illustrates major components in an apparatus that decodes a signal that was encoded according to the present invention. Signal path 41 receives an encoded signal conveying an encoded representation of information intended for human perception, such as aural or visual information, for example. Deformatter 50 obtains the encoded information in the form of codes from the encoded signal and passes the codes to multi-stage decoder 60. Multi-stage decoder 60 decompresses the codes into signal components that signal synthesizer 70 can synthesize into an output signal that is a replica of an original input signal.

1. Signal Synthesis

Figure 9:
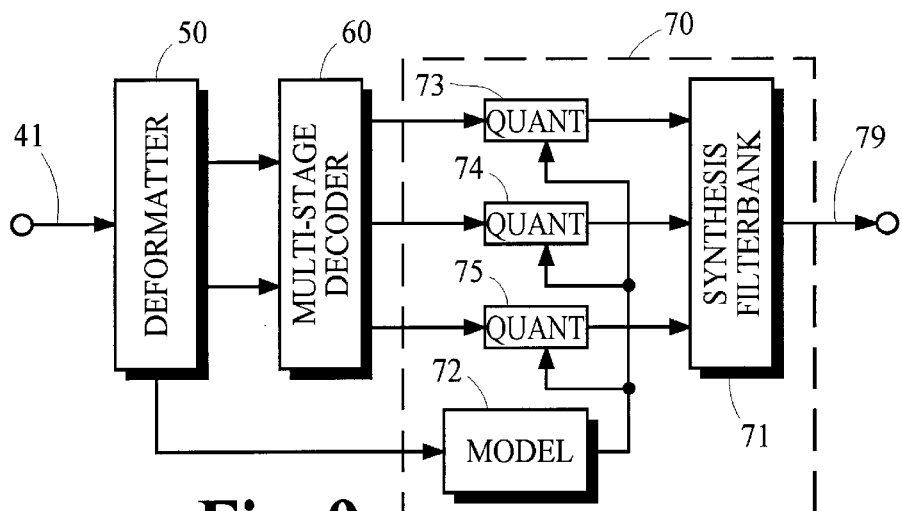
FIG. 9 is a block diagram of a split-band decoding apparatus that may be used to decode an encoded signal that was encoded according to psychoperceptual principles.

FIG. 9 is a block diagram of a split-band decoding apparatus that may be used to decode an encoded signal that was encoded according to psychoperceptual principles. Although the following discussion refers to audio signal encoding according to psychoacoustic principles, the use of psychoacoustic principles or other psychoperceptual principles is not essential to the present invention.

Referring to FIG. 9, dequantizers 73, 74 and 75 receive decoded quantized signal components from multi-stage decoder 60 and then dequantizes them into a form that can be used by synthesis filterbank 71. In the forward-adaptive system shown, model 72 controls the dequantization step size for dequantizers 73, 74 and 75 in response to control information obtained from the encoded signal by deformatter 50. In an alternate backward-adaptive implementation not shown in the figures, model 72 derives the dequantization step size by assessing the psychoacoustic properties of the original input signal from information obtained from the encoded information.

Synthesis filterbank 71 processes the dequantized signal components to synthesize an output signal along path 79, which is a replica of an original input signal. In perceptual coding systems, the synthesized replica is generally not identical to the original input signal but ideally is perceptually indistinguishable from the original input signal. Synthesis filter bank 71 may be implemented in a wide variety of ways that are complementary to the ways in which the analysis filterbank is implemented in an associated encoding apparatus.

2. Signal Component Decoding

Figures 10, 11:
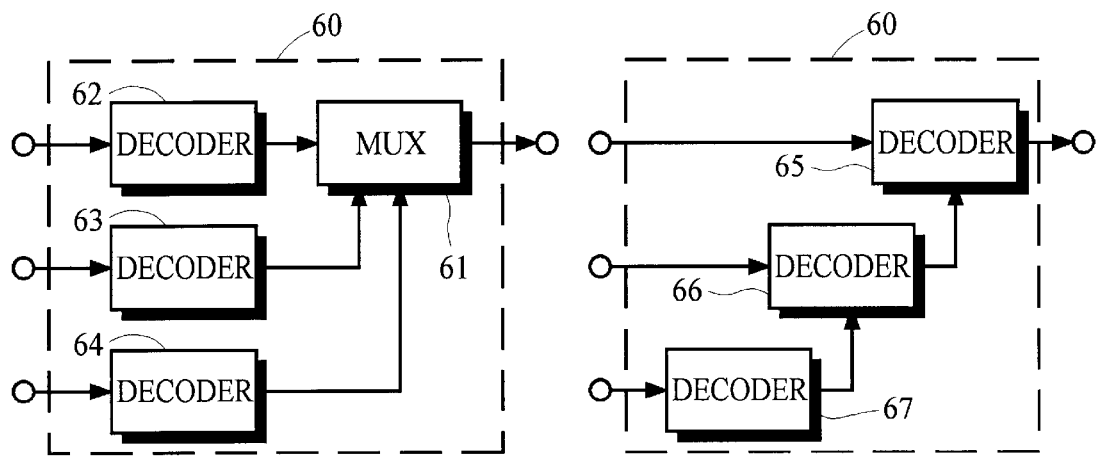
FIGS. 10 and 11 are block diagrams of multi-stage decoders.

FIGS. 10 and 11 illustrate block diagrams of two different implementations of multi-stage decoder 60. Referring to FIG. 10, decoder 62 applies a decoding process to codes received from deformatter 50 to recover groups of elements corresponding to signal components placed into a first classification at the time of encoding. Decoders 63 and 64 apply respective decoding process to codes received from deformatter 50 to recover groups of elements corresponding to signal components placed into second and third classifications, respectively, at the time of encoding. Decoders for three classifications are shown in this example, however, the number of classifications used in any particular coding system should be chosen to balance coding efficiency against data storage requirements and computational cost.

a) Decoding Dimension

The decoding process that is applied by each of decoders 62, 63 and 64 is an inverse process to the respective encoding process used to generate the codes and has a dimension that is equal to the number of elements in the group that it recovers. Stated differently, each decoding process recovers a group of elements by mapping a code to an appropriate point in an N-dimensional space that defines the values of the elements, where N is equal to the number of elements in the group. As explained above, the elements in the groups may either represent signal component values or are special tokens.

In a preferred implementation of a coding system in which arithmetic encoding is used to generate the codes, decoders 62, 63 and 64 each apply an appropriate arithmetic decoding process to the codes to losslessly recover the groups of elements that were encoded by the encoding process. Additional information may be obtained from the Thomas et al. and Witten et al. references cited above.

Continuing the examples discussed above, several implementations of multi-stage decoder 60 are discussed below.

(1) Bottom-to-Top Decoding

One implementation of multi-stage decoder 60 is complementary to the bottom-to-top implementation of multi-stage encoder 20 discussed above. In this implementation, all signal components have a corresponding element in one of the groups recovered for the lowest classification level, and a generally diminishing number of signal components have a corresponding element in groups recovered for progressively higher classification levels.

Decoder 62 applies a decoding process to codes it receives from deformatter 50 to generate first groups of elements in which an element either represents the value of a respective signal component placed into classification 1 or it is a token that is a type of placeholder for a signal component not placed into classification 1. These first groups of elements are passed to multiplexor 61.

Decoder 63 applies a decoding process to codes it receives from deformatter 50 to generate second groups of elements in which an element either represents the value of a respective signal component placed into classification 2 or it is a token or placeholder for a signal component not placed into either classification 1 or classification 2. These second groups of elements are passed to multiplexor 61.

Decoder 64 applies a decoding process to codes it receives from deformatter 50 to generate third groups of elements in which an element represents the value of a respective signal component placed into classification 3. These third groups of elements are passed to multiplexor 61.

Multiplexor 61 merges the elements it receives in the first, second and third groups of elements to obtain a complete set of signal components that are suitable to pass to signal synthesizer 70. This may be accomplished by replacing the token elements in the second groups with the appropriate elements from the third groups, and then replacing the token elements in the first groups with the appropriate elements in the second groups. This merging process is explained below with reference to the example discussed above and illustrated in FIGS. 5 to 7.

Referring to FIGS. 6 and 7, token elements in second groups $G_{2,1}$ through $G_{2,3}$ are replaced by corresponding elements in third groups $G_{3,1}$ and $G_{3,2}$. Element $E_{2,2}$ in group $G_{2,1}$ is a token indicating signal component $C_4$ is not placed into classification 2, and element $E_{3,1}$ in group $G_{3,1}$ represents the value of signal component $C_4$. Element $E_{2,3}$ in group $G_{2,2}$ is a token indicating signal component $C_5$ is not placed into classification 2, and element $E_{3,1}$ in group $G_{3,1}$ represents the value of signal component $C_5$. Multiplexor 61 replaces element $E_{2,2}$ in group $G_{2,1}$ with element $E_{3,1}$ in group $G_{3,1}$, and also replaces element $E_{2,3}$ in group $G_{2,2}$ with element $E_{3,1}$ in group $G_{3,1}$. Element $E_{2,6}$ in group $G_{2,3}$ is a place holder that does not represent any signal component; therefore, no replacement is made for this element. The place-holder status of element $E_{2,6}$ can be recognized if element $E_{2,6}$ has a special value reserved for this purpose, or it can be deduced by the fact there is no corresponding element in a third group.

At this point in the merge process, all token elements in first groups $G_{6,2}$ through $G_{1,4}$ have corresponding elements in second groups $G_{2,1}$ through $G_{2,3}$ that represent the value of a respective signal component. Element $E_{1,1}$ in group $G_{1,1}$, elements $E_{1,4}$ and $E_{1,5}$ in group $G_{1,2}$, and elements $E_{1,8}$ and $E_{1,11}$ in group $G_{1,3}$ are tokens indicating signal components $C_1$, $C_4$, $C_5$, $C_8$ and $C_{11}$, respectively, are not placed into classification 1. Elements $E_{2,1}$, $E_{2,2}$, $E_{2,3}$, $E_{2,4}$ and $E_{2,5}$ in the second groups $G_{2,1}$ through $G_{2,3}$ values of signal components $C_1$, $C_4$, $C_5$, $C_8$ and $C_{11}$, respectively. Multiplexor 61 completes the merge process by replacing each token in the first groups with the corresponding element in the second groups. At the end of this process, the first level groups contain elements that represent the values of signal components $C_0$ through $C_{15}$. This set of signal components is passed to signal synthesizer 70, which synthesizes an output signal that is a replica of an original input signal.

(2) Top-to-Bottom Decoding

Another implementation of multi-stage decoder 60 is complementary to the top-to-bottom implementation of multi-stage encoder 20. In this implementation, all signal components have a corresponding element in one of the groups recovered for the highest classification level, and a generally diminishing number of signal components have corresponding elements in the groups recovered for progressively lower classification levels.

In this implementation, decoder 64 applies a decoding process to codes it receives from deformatter 50 to generate first groups of elements in which an element either represents the value of a respective signal component placed into classification 3 or it is a token that is a type of placeholder for a signal component not placed into classification 3. These first groups of elements are passed to multiplexor 61.

Decoder 63 applies a decoding process to codes it receives from deformatter 50 to generate second groups of elements in which an element either represents the value of a respective signal component placed into classification 2 or it is a token or placeholder for a signal component not placed into either classification 2 or classification 3. These second groups of elements are passed to multiplexor 61.

Decoder 62 applies a decoding process to codes it receives from deformatter 50 to generate third groups of elements in which an element represents the value of a respective signal component placed into classification 1. These third groups of elements are passed to multiplexor 61.

Multiplexor 61 merges the elements it receives in the first, second and third groups of elements to obtain a complete set of signal components that are suitable to pass to signal synthesizer 70. This may be accomplished in a way that is similar to the way discussed above for the bottom-to-top implementation.

The top-to-bottom implementation may be used advantageously in scalable coding applications. A minimum quality reproduction can be provided by synthesizing only the information recovered by encoder 64. A moderate quality reproduction can be provided by synthesizing the information recovered by encoders 64 and 63. A maximum quality reproduction can be provided by synthesizing the information recovered by encoders 64, 63 and 62. In coding applications that provide only a minimum or moderate quality of reproduction, synthesized substitute values are provided for signal components placed into the lower classifications.

(3) Decoding Without Tokens

In implementations that do not use tokens, multiplexor 61 carries out a merge process according to control information that is obtained from the encoded signal by deformatter 50. In one implementation, control information indicates the classification for each signal component. This indication of classification expressly indicates for each respective signal component which of the decoders 62, 63 and 64 recovers a group having an element that represents the value of that respective signal component. Multiplexor 61 uses this control information to select the appropriate elements from the various groups during the merge process.

b) Distributed Multiplexing

FIG. 11 illustrates an alternative implementation of multi-stage decoder 60. In this implementation, signal component multiplexing and decoding is distributed among three decoding components.

Decoder 67 receives codes from deformatter 50 and applies a decoding process to these codes to obtain third groups of elements representing values of signal components placed into classification 3. These third groups of elements are passed to decoder 66.

Decoder 66 receives codes from deformatter 50 and applies a decoding process to the codes to obtain second groups of elements that either represent values of signal components placed into classification 2 or are tokens representing signal components placed into classification 3. Decoder 66 receives elements from decoder 67 that represent values of signal components placed into classification 3 and substitutes these elements for the tokens in the second groups of elements.

Decoder 65 receives codes from deformatter 50 and applies a decoding process to the codes to obtain first groups of elements that either represent values of signal components placed into classification 1 or are tokens representing signal components placed not placed into classification 1. Decoder 65 receives elements from decoder 66 that represent values of signal components placed into classifications 2 and 3, and substitutes these elements for the tokens in the first groups of elements.

At the conclusion of this process, decoder 65 has obtained groups of elements that represent the values of all signal components. This set of signal components is passed to signal synthesizer 70, which synthesizes an output signal that is a replica of an original input signal.

This distributed-multiplexing implementation just described is analogous to the implementation for bottom-to-top decoding discussed above. Distributed multiplexing may also be used in implementations that are analogous to the implementations for top-to-bottom decoding and for decoding without tokens.

c) Additional Features

If groups of elements represent some differential value for respective signal components, the actual value of the signal components can be obtained by adding an appropriate amount to each difference. Decoders that are complementary to the differential-coding example discussed above add the lower bound of the range associated with a classification to values recovered by the decoding process. In encoders 64, 67 for classification 3, for example, the value of signal component $C_K$ would be obtained from the sum $(E_{3,J}+R_{3L})$, where $E_{3,J}$ is the corresponding element and $R_{3L}$ is equal to 3, which is the lower bound for the range of classification 3.

Multi-stage decoder 60 may apply different decoding processes in the various stages as appropriate to be complementary to the encoding processes that were used to generate the encoded signal.

What is claimed is:

1. A method for encoding signal components that represent an input signal conveying information for human perception, wherein the method comprises steps that perform the acts of:
    (a) placing each of the signal components into one of a plurality of classifications according to signal component value, wherein each classification is associated with a range of values and has a rank representing the span of the associated range of values, and wherein a respective signal component is placed into the classification associated with the range of values that includes the value of the respective signal component; and
    (b) for a respective classification,
        (1) assembling signal components into one or more groups, each group having a number of elements to encode that varies inversely with the rank of the respective classification; and
        (2) applying an encoding process to each of the groups, wherein the encoding process that is applied to a respective group has a dimension that is proportional to the number of elements in the respective group.

2. A method according to claim 1 wherein each element in a group is a respective signal component placed into the respective classification.

3. A method according to claim 1 wherein each element in a group either is a respective signal component placed into the respective classification or is a token representing a respective signal component not placed into the respective classification.

4. A method according to claim 3 wherein the tokens represent only the signal components that are placed into another classification having an associated range that is higher than the associated range of the respective classification.

5. A method according to claim 3 wherein the tokens represent only the signal components that are placed into another classification having an associated range that is lower than the associated range of the respective classification.

6. A method according to claim 1 wherein the signal components represent spectral components of the input signal and wherein the method comprises steps that performs the acts of
    obtaining the signal components by applying one or more filters or one or more transforms to the input signal; and
    quantizing the signal components wth quantization step sizes established according to psychoperceptual principles.

7. A method according to claim 6 wherein the input signal conveys aural information and the signal components are quantized according to perceptual principles of the human aural system.

8. A method according to claim 6 wherein the input signal conveys visual information and the signal components are quantized according to perceptual principles of the human visual system.

9. A method according to claim 1 wherein each signal component is placed into a respective classification according to signal component magnitude.

10. A method according to claim 1 wherein each classification is uniquely associated with a range of signal values within a set of ranges.

11. A method according to claim 1 wherein the encoding process is a lossless arithmetic encoding process.

12. A method according to claim 1 that comprises analyzing the signal components to adaptively determine the ranges for one or more of the classifications.

13. A method for encoding signal components that represent an input signal conveying information for human perception, wherein the method comprises steps that perform the acts of:
    placing some of the signal components into a first classification according to signal component value;
    assembling the signal components placed into the first classification into one or more first groups each having a number of elements that is equal to a first number;
    applying an encoding process to each of the first groups, wherein the encoding process has a dimension that is proportional to the first number;
    placing at least some of the signal components not placed into the first classification into a second classification according to signal component value;
    assembling the signal components placed into the second classification into one or more second groups each having a number of elements that is equal to a second number, wherein the second number is not equal to the first number; and
    applying an encoding process to each of the second groups, wherein the encoding process has a dimension that is proportional to the second number.

14. A method according to claim 13 wherein each element in a first group is a respective signal component placed into the first classification and each element in a second group is a respective signal component placed into the second classification.

15. A method according to claim 13 wherein each element in a first group either is a respective signal component placed into the first classification or is a token representing a respective signal component that is not placed into the first classification.

16. A method according to claim 15 that comprises:
placing at least some of the signal components not placed into either the first classification or the second classification into a third classification according to signal component value;
assembling the signal components placed into the third classification into one or more third groups each having a number of elements that is equal to a third number, wherein the third number is not equal to either the first number or the second number; and
applying an encoding process to each of the third groups, wherein the encoding process has a dimension that is proportional to the third number;
and wherein each element in a second group either is a respective signal component placed into the second classification or is a token representing a respective signal component that is not placed into either the first classification or the second classification.

17. A method according to claim 13 wherein the signal components represent spectral components of the input signal and wherein the method comprises steps that performs the acts of:
obtaining the signal components by applying one or more filters or one or more transforms to the input signal; and
quantizing the signal components wth quantization step sizes established according to psychoperceptual principles.

18. A method according to claim 17 wherein the input signal conveys aural information and the signal components are quantized according to perceptual principles of the human aural system.

19. A method according to claim 17 wherein the input signal conveys visual information and the signal components are quantized according to perceptual principles of the human visual system.

20. A method according to claim 13 wherein each signal component is placed into a respective classification according to signal component magnitude.

21. A method according to claim 13 wherein a lossless arithmetic encoding process is applied to the first and second groups.

22. A method according to claim 13 that comprises analyzing the signal components to adaptively determine ranges of values to use for placing the signal components into classifications according to signal component value.

23. A method for decoding codes to obtain signal components that represent an output signal conveying information for human perception, wherein the method comprises steps that perform the acts of:
(a) receiving the codes, wherein each code represents one or more signal components placed into one of a plurality of classifications according to signal component value, wherein each classification is associated with a range of values and has a rank representing the span of the associated range of values, and wherein the range of values that is associated with a respective classification includes the values of the one or more signal components placed in the respective classification; and
(b) for each respective code,
(1) identifying the respective classification of the signal components represented by the respective code; and
(2) applying a decoding process to the respective code to obtain a group of elements, the group having a number of elements that varies inversely with the rank of the respective classification, wherein the decoding process that is applied to the respective code has a dimension that is proportional to the number of elements in the group of elements; and
(c) obtaining the one or more signal components from the group of elements.

24. A method according to claim 23 wherein each element in a group is a respective signal component placed into the respective classification.

25. A method according to claim 23 wherein each element in a group either is a respective signal component placed into the respective classification or is a token representing a respective signal component not placed into the respective classification.

26. A method according to claim 25 wherein the tokens represent only the signal components that are placed into another classification having an associated range that is higher than the associated range of the respective classification.

27. A method according to claim 25 wherein the tokens represent only the signal components that are placed into another classification having an associated range that is lower than the associated range of the respective classification.

28. A method according to claim 23 wherein the signal components represent spectral components of the output signal and wherein the method comprises steps that performs the acts of:
dequantizing the signal components wth dequantization step sizes established according to psychoperceptual principles; and
obtaining the output signal by applying one or more filters or one or more inverse transforms to the dequantized signal components.

29. A method according to claim 28 wherein the output signal conveys aural information and the signal components are dequantized according to perceptual principles of the human aural system.

30. A method according to claim 28 wherein the output signal conveys visual information and the signal components are dequantized according to perceptual principles of the human visual system.

31. A method according to claim 23 wherein each signal component is placed into a respective classification according to signal component magnitude.

32. A method according to claim 23 wherein each classification is uniquely associated with a range of signal values within a set of ranges.

33. A method according to claim 23 wherein the decoding process is a lossless arithmetic decoding process.

34. A method for decoding codes to obtain signal components that represent an output signal conveying information for human perception, wherein the method comprises steps that perform the acts of
applying a decoding process to a first code to obtain a first group having a first number of elements, wherein the decoding process has a dimension that is proportional to the first number;
obtaining from the first group one or more signal components placed into a first classification and having values within a range of values associated with the first classification;
applying a decoding process to a second code to obtain a respective second group having a second number of elements, wherein the decoding process has a dimension that is proportional to the second number; and
obtaining from the second group one or more signal components placed into a second classification having values within a range of values associated with the second classification.

35. A method according to claim 34 wherein each element in a first group is a respective signal component placed into the first classification and each element in a second group is a respective signal component placed into the second classification.

36. A method according to claim 34 wherein each element in a first group either is a respective signal component placed into the first classification or is a token representing a respective signal component that is not placed into the first classification.

37. A method according to claim 36 that comprises:
applying a decoding process to a third code to obtain a respective third group having a third number of elements, wherein the decoding process has a dimension that is proportional to the third number; and
obtaining from the third group one or more signal components placed into a third classification having values within a range of values associated with the third classification;
and wherein each element in a second group either is a respective signal component placed into the second classification or is a token representing a respective signal component that is not placed into either the first classification or the second classification.

38. A method according to claim 34 wherein the signal components represent spectral components of the output signal and wherein the method comprises steps that performs the acts of:
dequantizing the signal components wth dequantization step sizes established according to psychoperceptual principles; and
obtaining the output signal by applying one or more filters or one or more inverse transforms to the dequantized signal components.

39. A method according to claim 38 wherein the output signal conveys aural information and the signal components are dequantized according to perceptual principles of the human aural system.

40. A method according to claim 38 wherein the output signal conveys visual information and the signal components are dequantized according to perceptual principles of the human visual system.

41. A method according to claim 34 wherein each signal component is placed into a respective classification according to signal component magnitude.

42. A method according to claim 34 wherein a lossless arithmetic decoding process is applied to the first and second groups.

43. An apparatus for encoding signal components that represent an input signal conveying information for human perception, wherein the apparatus comprises:
information storage; and
signal processing circuitry coupled to the information storage and having an input to receive the signal components and having an output to provide an encoded representation of the signal components, wherein the signal processing circuitry is adapted to process the signal components by:
(a) placing each of the signal components into one of a plurality of classifications according to signal component value, wherein each classification is associated with a range of values and has a rank representing the span of the associated range of values, and wherein a respective signal component is placed into the classification associated with the range of values that includes the value of the respective signal component;
(b) for a respective classification, assembling signal components into one or more groups, each group having a number of elements to encode that varies inversely with the rank of the respective classification, and generating codes by applying an encoding process to each of the groups, wherein the encoding process that is applied to a respective group has a dimension that is proportional to the number of elements in the respective group; and
(c) assembling the codes into the encoded representation.

44. An apparatus according to claim 43 wherein each element in a group is a respective signal component placed into the respective classification.

45. An apparatus according to claim 43 wherein each element in a group either is a respective signal component placed into the respective classification or is a token representing a respective signal component not placed into the respective classification.

46. An apparatus according to claim 45 wherein the tokens represent only the signal components that are placed into another classification having an associated range that is higher than the associated range of the respective classification.

47. An apparatus according to claim 45 wherein the tokens represent only the signal components that are placed into another classification having an associated range that is lower than the associated range of the respective classification.

48. An apparatus according to claim 43 wherein the signal components represent spectral components of the input signal and wherein the signal processing circuitry is adapted to process the signal components by:
obtaining the signal components by applying one or more filters or one or more transforms to the input signal; and
quantizing the signal components wth quantization step sizes established according to psychoperceptual principles.

49. An apparatus according to claim 48 wherein the input signal conveys aural information and the signal components are quantized according to perceptual principles of the human aural system.

50. An apparatus according to claim 48 wherein the input signal conveys visual information and the signal components are quantized according to perceptual principles of the human visual system.

51. An apparatus according to claim 43 wherein each signal component is placed into a respective classification according to signal component magnitude.

52. An apparatus according to claim 43 wherein each classification is uniquely associated with a range of signal values within a set of ranges.

53. An apparatus according to claim 43 wherein the encoding process is a lossless arithmetic encoding process.

54. An apparatus according to claim 43 that comprises analyzing the signal components to adaptively determine the ranges for one or more of the classifications.

55. An apparatus for encoding signal components that represent an input signal conveying information for human perception, wherein the apparatus comprises:
information storage; and
signal processing circuitry coupled to the information storage and having an input to receive the signal components and having an output to provide an encoded representation of the signal components, wherein the signal processing circuitry is adapted to process the signal components by:

placing some of the signal components into a first classification according to signal component value;

assembling the signal components placed into the first classification into one or more first groups each having a number of elements that is equal to a first number;

applying an encoding process to each of the first groups, wherein the encoding process has a dimension that is proportional to the first number;

placing at least some of the signal components not placed into the first classification into a second classification according to signal component value;

assembling the signal components placed into the second classification into one or more second groups each having a number of elements that is equal to a second number, wherein the second number is not equal to the first number;

generating codes by applying an encoding process to each of the second groups, wherein the encoding process has a dimension that is proportional to the second number; and assembling the codes into the encoded representation.

56. An apparatus according to claim 55 wherein each element in a first group is a respective signal component placed into the first classification and each element in a second group is a respective signal component placed into the second classification.

57. An apparatus according to claim 55 wherein each element in a first group either is a respective signal component placed into the first classification or is a token representing a respective signal component that is not placed into the first classification.

58. An apparatus according to claim 57 wherein the signal processing circuitry is adapted to process the signal components by:

placing at least some of the signal components not placed into either the first classification or the second classification into a third classification according to signal component value;

assembling the signal components placed into the third classification into one or more third groups each having a number of elements that is equal to a third number, wherein the third number is not equal to either the first number or the second number; and applying an encoding process to each of the third groups, wherein the encoding process has a dimension that is proportional to the third number;

and wherein each element in a second group either is a respective signal component placed into the second classification or is a token representing a respective signal component that is not placed into either the first classification or the second classification.

59. An apparatus according to claim 55 wherein the signal components represent spectral components of the input signal and wherein the signal processing circuitry is adapted to process the signal components by:

obtaining the signal components by applying one or more filters or one or more transforms to the input signal; and quantizing the signal components wth quantization step sizes established according to psychoperceptual principles.

60. An apparatus according to claim 59 wherein the input signal conveys aural information and the signal components are quantized according to perceptual principles of the human aural system.

61. An apparatus according to claim 59 wherein the input signal conveys visual information and the signal components are quantized according to perceptual principles of the human visual system.

62. An apparatus according to claim 55 wherein each signal component is placed into a respective classification according to signal component magnitude.

63. An apparatus according to claim 55 wherein a lossless arithmetic encoding process is applied to the first and second groups.

64. An apparatus according to claim 55 that comprises analyzing the signal components to adaptively determine ranges of values to use for placing the signal components into classifications according to signal component value.

65. An apparatus for decoding codes to obtain signal components that represent an output signal conveying information for human perception, wherein the apparatus comprises:

information storage; and signal processing circuitry coupled to the information storage and having an input to receive the codes and having an output to provide the output signal, wherein the signal processing circuitry is adapted to process the codes by:

(a) receiving the codes, wherein each code represents one or more signal components placed into one of a plurality of classifications according to signal component value, wherein each classification is associated with a range of values and has a rank representing the span of the associated range of values, and wherein the range of values that is associated with a respective classification includes the values of the one or more signal components placed in the respective classification;

(b) for each respective code, identifying the respective classification of the signal components represented by the respective code, and applying a decoding process to the respective code to obtain a group of elements, the group having a number of elements that varies inversely with the rank of the respective classification, wherein the decoding process that is applied to the respective code has a dimension that is proportional to the number of elements in the group of elements; and (c) obtaining the one or more signal components from the group of elements.

66. An apparatus according to claim 65 wherein each element in a group is a respective signal component placed into the respective classification.

67. An apparatus according to claim 65 wherein each element in a group either is a respective signal component placed into the respective classification or is a token representing a respective signal component not placed into the respective classification.

68. An apparatus according to claim 67 wherein the tokens represent only the signal components that are placed into another classification having an associated range that is higher than the associated range of the respective classification.

69. An apparatus according to claim 67 wherein the tokens represent only the signal components that are placed into another classification having an associated range that is lower than the associated range of the respective classification.

70. An apparatus according to claim 65 wherein the signal components represent spectral components of the output signal and wherein the signal processing circuitry is adapted to process the codes by:

dequantizing the signal components wth dequantization step sizes established according to psychoperceptual principles; and obtaining the output signal by applying one or more filters or one or more inverse transforms to the dequantized signal components.

71. An apparatus according to claim 70 wherein the output signal conveys aural information and the signal components are dequantized according to perceptual principles of the human aural system.

72. An apparatus according to claim 70 wherein the output signal conveys visual information and the signal components are dequantized according to perceptual principles of the human visual system.

73. An apparatus according to claim 65 wherein each signal component is placed into a respective classification according to signal component magnitude.

74. An apparatus according to claim 65 wherein each classification is uniquely associated with a range of signal values within a set of ranges.

75. An apparatus according to claim 65 wherein the decoding process is a lossless arithmetic decoding process.

76. An apparatus for decoding codes to obtain signal components that represent an output signal conveying information for human perception, wherein the apparatus comprises:

information storage; and signal processing circuitry coupled to the information storage and having an input to receive the codes and having an output to provide the output signal, wherein the signal processing circuitry is adapted to process the codes by:

applying a decoding process to a first code to obtain a first group having a first number of elements, wherein the decoding process has a dimension that is proportional to the first number;

obtaining from the first group one or more signal components placed into a first classification and having values within a range of values associated with the first classification;

applying a decoding process to a second code to obtain a respective second group having a second number of elements, wherein the decoding process has a dimension that is proportional to the second number; and obtaining from the second group one or more signal components placed into a second classification having values within a range of values associated with the second classification.

77. An apparatus according to claim 76 wherein each element in a first group is a respective signal component placed into the first classification and each element in a second group is a respective signal component placed into the second classification.

78. An apparatus according to claim 76 wherein each element in a first group either is a respective signal component placed into the first classification or is a token representing a respective signal component that is not placed into the first classification.

79. An apparatus according to claim 78 wherein the signal processing circuitry is adapted to process the codes by:

applying a decoding process to a third code to obtain a respective third group having a third number of elements, wherein the decoding process has a dimension that is proportional to the third number; and obtaining from the third group one or more signal components placed into a third classification having values within a range of values associated with the third classification;

and wherein each element in a second group either is a respective signal component placed into the second classification or is a token representing a respective signal component that is not placed into either the first classification or the second classification.

80. An apparatus according to claim 76 wherein the signal components represent spectral components of the output signal and wherein the signal processing circuitry is adapted to process the codes by:

dequantizing the signal components wth dequantization step sizes established according to psychoperceptual principles; and obtaining the output signal by applying one or more filters or one or more inverse transforms to the dequantized signal components.

81. An apparatus according to claim 80 wherein the output signal conveys aural information and the signal components are dequantized according to perceptual principles of the human aural system.

82. An apparatus according to claim 80 wherein the output signal conveys visual information and the signal components are dequantized according to perceptual principles of the human visual system.

83. An apparatus according to claim 76 wherein each signal component is placed into a respective classification according to signal component magnitude.

84. An apparatus according to claim 76 wherein a lossless arithmetic decoding process is applied to the first and second groups.

* * * * *

UNITED STATES PATENT AND TRADEMARK OFFICE
CERTIFICATE OF CORRECTION

PATENT NO. : 6,735,339 B1  
APPLICATION NO. : 09/699101  
DATED : May 11, 2004  
INVENTOR(S) : Anil Wamanrao Ubale Page 1 of 1

It is certified that error appears in the above-identified patent and that said Letters Patent is hereby corrected as shown below:

In Column 7, lines 26 through 29 of the patent, the classifications should appear as follows:

Classification 1: $0 \leq |x| \leq 3$      (1)  
Classification 2: $3 < |x| \leq 30$      (2)  
Classification 3: $30 < |x| \leq 128$      (3)

as they appear on page 10 lines 23-25 of the application.

In Column 12 lines 24 through 29 of the patent, the classifications should appear as follows:

Classification 1: $0 \leq |x| \leq 1$      (4)  
Classification 2: $-9 \leq x < -1$ and $1 < x < 9$      (5)  
Classification 3: $-136 \leq x < -9$ and $9 \leq x \leq 136$      (6)  
Classification 4: $136 < |x| \leq 8192$      (7)

as they appear on page 17 lines 30-31 and page 18 lines 1-2 of the application.

Signed and Sealed this

Seventeenth Day of July, 2007

JON W. DUDAS  
*Director of the United States Patent and Trademark Office*